US006821878B2

United States Patent
Danvir et al.

(10) Patent No.: US 6,821,878 B2
(45) Date of Patent: Nov. 23, 2004

(54) AREA-ARRAY DEVICE ASSEMBLY WITH PRE-APPLIED UNDERFILL LAYERS ON PRINTED WIRING BOARD

(75) Inventors: Janice Danvir, Arlington Heights, IL (US); Jing Qi, Lake Zurich, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/376,405

(22) Filed: Feb. 27, 2003

(65) Prior Publication Data

US 2004/0169275 A1 Sep. 2, 2004

(51) Int. Cl.[7] .......................... H01L 21/44; H01L 21/48
(52) U.S. Cl. .................. 438/613; 438/108; 438/106; 438/121; 438/128
(58) Field of Search ................ 438/108, 106, 438/613, 121, 128

(56) References Cited

U.S. PATENT DOCUMENTS

| | | | |
|---|---|---|---|
| 5,289,631 A | * | 3/1994 | Koopman et al. ............ 29/840 |
| 5,814,401 A | | 9/1998 | Gamota et al. |
| 5,925,936 A | | 7/1999 | Yamaji |
| 5,930,598 A | * | 7/1999 | Wille et al. ................. 438/108 |
| 6,059,894 A | * | 5/2000 | Pendse ........................ 148/23 |
| 6,100,114 A | * | 8/2000 | Milkovich et al. .......... 438/127 |
| 6,121,689 A | | 9/2000 | Capote et al. |
| 6,194,788 B1 | | 2/2001 | Gilleo et al. |
| 6,204,163 B1 | * | 3/2001 | Panchou et al. ............ 438/613 |
| 6,228,678 B1 | * | 5/2001 | Gilleo et al. ................ 438/108 |
| 6,294,840 B1 | | 9/2001 | McCormick |
| 6,365,441 B1 | | 4/2002 | Ralser et al. |
| 6,410,415 B1 | * | 6/2002 | Estes et al. ................. 438/612 |
| 6,518,096 B2 | * | 2/2003 | Chan et al. ................. 438/118 |

FOREIGN PATENT DOCUMENTS

| | | | | |
|---|---|---|---|---|
| JP | 200-357714 | * | 12/2000 | ........... H01L/21/60 |
| WO | WO 99/56312 | | 11/1999 | |

* cited by examiner

*Primary Examiner*—Jasmine Clark
(74) *Attorney, Agent, or Firm*—Cardinal Law Group

(57) ABSTRACT

The invention provides a method of attaching an area-array device such as a bumped flip chip to an electrical substrate. An underfill material is applied to a portion of the electrical substrate, and the underfill material is heated to an underfill-material staging temperature. A bumped area-array device is provided, the bumped area-array device including an interconnection surface and a plurality of connective bumps extending from the interconnection surface. The interconnection surface of the bumped area-array device is positioned adjacent the applied underfill material. The bumped area-array device is heated to electrically connect the connective bumps to the electrical substrate. The invention also provides a flip-chip assembly and a printed wiring board panel with pre-applied underfill material.

16 Claims, 7 Drawing Sheets

FIG. 6 ved. When cooled, the
AREA-ARRAY DEVICE ASSEMBLY WITH PRE-APPLIED UNDERFILL LAYERS ON PRINTED WIRING BOARD

STATEMENT REGARDING FEDERALLY SPONSORED RESEARCH

This invention was made with United States Government support under Agreement NO. 70NANB8H4007 awarded by the National Institute of Standards and Technology (NIST). The United States Government has certain rights in the invention.

The U.S. Government has a paid-up license in this invention and the right in limited circumstances to require the patent owner to license others on reasonable terms as provided for by the terms of contract No. NIST-ATP 70NANB8H4007 awarded by the National Institute of Standards and Technology.

FIELD OF THE INVENTION

This invention relates generally to integrated circuit packaging and printed circuit board assembly. In particular, the invention relates to a bumped area-array device such as a flip chip attached to a printed wiring board with pre-applied underfill material, and to a method of manufacturing flip-chip assemblies using pre-applied underfill on the circuit boards.

BACKGROUND OF THE INVENTION

The proliferation of bumped area-array devices such as flip-chips and ball-grid arrays during the past decade makes flip-chip die mounting a preferred approach for a widening variety of flip chips and other electronic packages. Bumped area-array devices and flip-chip assemblies can be described as active components, usually integrated circuits that are directly connected facedown to printed wiring boards (PWB) and other electronic substrates by means of conductive bumps on the chip or package bond pads. They have become popular in cost-conscious, high volume production of electronic devices such as consumer watches, smart cards, radio-frequency identification cards, and cellular telephones.

As more of these components are assembled to form cost-effective electronic modules and flip-chip assemblies, the need increases for an underfill system that obviates the time-consuming sequences required by capillary flow of underfill materials in current assembly processes. After application and heat-treatment, underfill material structurally reinforces the solder bumps, mechanically adheres the flip chip to the PWB, and improves the reliability of the assembly.

Flip chips are formed with ball-shaped beads or bumps of solder affixed to their input/output (I/O) bonding pads. The integrated circuit (IC) flip chip or die may be bonded directly to a packaging substrate or motherboard, without the need for a separate wire-bonded leadframe or for separate I/O connectors such as wires or tapes. During assembly, the chip is "flipped" onto its active circuit surface so that the solder balls form electrical connections directly between the bumped chip and conductive traces on an electronic substrate.

Underfill materials are typically applied between the active surface of the bumped IC and the PWB after the device has been soldered to the substrate. In the liquid underfill dispense technique, the underfill is applied at one or more edges of the flip-chip bonded die and capillary action wicks the fluid under the die. During heat treatment, the underfill material wets the die site on the PWB and the entire die surface and then is cured. When cooled, the underfill material securely bonds the die to the substrate and provides stress relief for the soldered bumps.

The capillary flow technology uses underfill material of a suitable polymer in the void between the chip and the substrate. The underfill material is typically dispensed around two adjacent sides of the bumped flip chip or area-array package, with the underfill material flowing by capillary action to fill the gap between the chip or package and the substrate. Baking or heat-treating then hardens the underfill material. If underfill material is delaminated from either the substrate or the bumped device, stress concentration and premature failure of solder joints may occur. Underfilling the chip with a subsequently cured encapsulant typically reduces solder joint cracking caused by thermal expansion mismatches between the chip and the substrate. The cured encapsulant reduces the level of stresses on the solder joints, induced by differential expansion and contraction. An example of an underfill material being applied around the periphery of a flip-chip assembly and partially wicked into the interior region is described by Raiser, et al., in U.S. Pat. No. 6,365,441, "Partial Underfill for Flip Chip Electronic Packages" issued Apr. 2, 2002.

Underfill methods may use an underfill layer on the active surface of the bumped chip and flux applied to a printed circuit board (PCB). Yamaji presents an underfill on the surface of a chip to the top ends of the bumps, as described in U.S. Pat. No. 5,925,936, "Semiconductor Device for Face Down Bonding to a Mounting Substrate and a Method of Manufacturing the Same" issued Jul. 20, 1999. Capote and others disclose a simplified process for flip-chip attachment to a substrate, which pre-coats the bumped IC chip with an encapsulant underfill material, as described in U.S. Pat. No. 6,121,689, "Semiconductor Flip-Chip Package and Method for the Fabrication Thereof" issued Sept. 19, 2000. The encapsulant encases the bumps that extend from contacts on the surface of the chip to the pads of the substrate.

An underfill process using intermixed flux and underfill that are applied to the die are described in U.S. Pat. No. 6,194,788, "Flip Chip with Integrated Flux and Underfill" by Gilleo et al. issued Feb. 27, 2001. The manufacturing process uses one step to apply a bumped flip chip with fluxing underfill on the bumped flip chip to a printed circuit board, rather than using separate fluxing and underfilling steps.

An underfill process using a selectively filled adhesive film with a fluxing agent in a portion of the film is described in U.S. Pat. No. 5,814,401, "Selectively Filled Adhesive Film Containing a Fluxing Agent" by Gamota, et al., issued Sept. 29, 1998.

Underfill material may be applied, for example, using no-flow underfill materials. The no-flow underfill materials may be dispensed, for example, with a needle dispensing system on the PCB or PWB prior to positioning the flip chips and subsequent to the heating of the assembly.

Current underfill processes make the assembly of encapsulated flip-chips on printed wire boards a time consuming, labor intensive and expensive process with a number of uncertainties. To join the bumped integrated circuit to the substrate, flux is generally is placed on the chip or electrical substrate and then the IC is placed on the substrate. The assembly is subjected to a solder reflowing thermal cycle, melting the bumps and soldering the chip to the substrate. The surface tension of the solder aids to self-align the chip to the substrate pads. Underfill encapsulation of the chip generally follows after reflow.

Major issues with the underfill process are the long processing times for both material dispensing and cure. The multi-step process of underfilling and curing of the encapsulant requires the material to flow through the tiny gap between the chip and the substrate. As the size of chips increase, the capillary action of the encapsulation procedure becomes even more time-consuming, and is more susceptible to void formation and to the separation of the polymer from fillers during application. Another general problem is that any flux residue remaining in the gap may reduce the adhesive and cohesive strengths of the underfill-encapsulating adhesive. Furthermore, as the pitch between adjacent bumps decreases and the density of bumps increases, uniform flow of underfill materials becomes increasingly difficult. One solution to this problem is disclosed in U.S. Pat. No. 6,294,840, "Dual-Thickness Solder Mask in Integrated Circuit Package," by McCormick, issued Sept. 25, 2001. This method requires two or more masks, each requiring alignment and intermediate processing.

Application of underfill materials at the wafer level, while attractive for large quantities of cost-effective bumped flip chips, requires uniformly applied underfill material around each of the bumps and well-controlled underfill thickness. Processes to achieve this on a bumped wafer are expensive and inefficient. It is difficult to gel sufficiently level coating between the bumps due to surface tension effects.

Application of the material may be to an unbumped wafer, but an added process step is required to form openings in the underfill coating. Also, the chemistry of the underfill is complicated by the need for photosensitivity. Wafer-applied underfill techniques are generally not directly applicable to other types of bumped devices such as bumped area-array packages.

Once coated, assembly of the flip chips to the PCB or PWB is complicated by the presence of the underfill. It is difficult for an automated component placement machine to recognize the bumps used for alignment because of the surrounding underfill, which interferes with vision recognition. Also, the coated chip must be held in place after placement and prior to soldering, requiring special equipment or processing steps. For example, the surface of the underfill may be heated prior to placement to soften the underfill and create a tacky surface for bonding to the PCB.

It would be beneficial to have a packaging technology for directly attaching area-array devices such as bumped flip chips to an underlying electrical substrate such as a PWB that allows secure electrical and mechanical die attach to the PWB, while eliminating the need for time-consuming dispensing operations for dispensing underfill materials around attached flip chips, as required by current capillary flow underfill methods. The packaging technology would allow bumped devices to be bonded effectively to an electrical substrate, with highly reliable electrical interconnections and protective underfill material for secure die bonding, stress relief for the bumps, and effective environmental protection. Furthermore, the technology would not require pre-coating material to the solder bumps, would eliminate bump-recognition challenges, would eliminate an additional tacking step typically needed to maintain alignment during reflow.

It is an object of this invention, therefore, to provide an improved method for attaching bumped area-array devices to an electrical substrate and a process for effectively and inexpensively applying underfill, having improvements that overcome the deficiencies and obstacles described above.

SUMMARY OF THE INVENTION

One aspect of the invention provides a method of attaching a bumped area-array device such as a bumped flip chip to an electrical substrate. An underfill material is applied to a portion of the electrical substrate. The applied underfill material is heated to an underfill-material staging temperature. A bumped area-array device is provided, the bumped area-array device including an interconnection surface and a plurality of connective bumps extending from the interconnection surface. The interconnection surface of the bumped area-array device is positioned adjacent the applied underfill material. The bumped area-array device is heated to electrically connect the connective bumps to the electrical substrate, and the underfill material flows around the bumps.

Another aspect of the invention provides a bumped area-array device assembly. The bumped area-array assembly includes a bumped flip chip with an active surface and a plurality of connective bumps extending from the active surface, and an electrical substrate with a pre-applied underfill material at a flip-chip receiving region. The flip chip is heated to electrically connect the connective bumps to the electrical substrate and to flow the underfill material from the flip-chip receiving region around the connective bumps to secure the flip chip to the electrical substrate Another aspect of the invention provides a printed wiring board panel with pre-applied underfill material, having a single-layer or a multiple-layer printed circuit board that includes a pre-applied underfill material disposed on a surface of the printed circuit board at a plurality of flip-chip receiving regions. The flip-chip receiving regions indicate flip-chip placement during flip-chip assembly.

The present invention is illustrated by the accompanying drawings of various embodiments and the detailed description given below. The drawings should not be taken to limit the invention to the specific embodiments, but are for explanation and understanding. The detailed description and drawings are merely illustrative of the invention rather than limiting, the scope of the invention being defined by the appended claims and equivalents thereof. The foregoing aspects and other attendant advantages of the present invention will become more readily appreciated by the detailed description taken in conjunction with the accompanying drawings.

BRIEF DESCRIPTION OF THE DRAWINGS

Various embodiments of the present invention are illustrated by the accompanying figures, wherein.

DETAILED DESCRIPTION OF THE PRESENTLY PREFERRED EMBODIMENTS

Figure 1A:
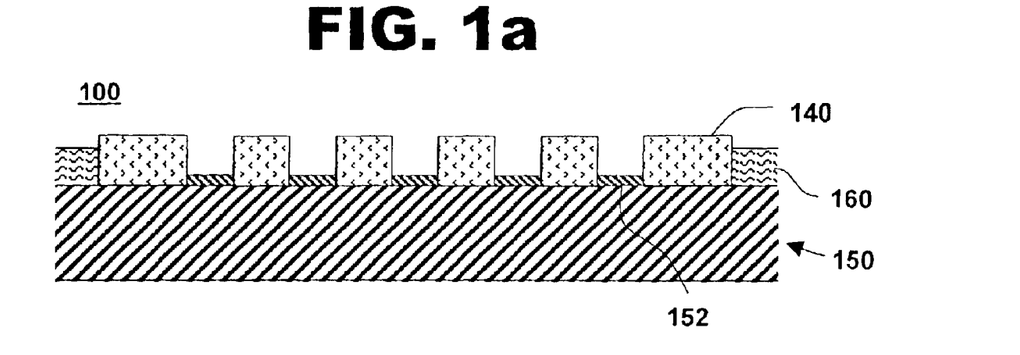
FIG. 1a illustrates a cross-sectional view of an electrical substrate with a solder mask and pre-applied underfill, in accordance with one embodiment of the current invention.

FIG. 1a shows a cross-sectional view of an electrical substrate with a solder mask and pre-applied underfill prior to bumped area-array device attachment, in accordance with one embodiment of the present invention at 100. The electrical substrate with pre-applied underfill includes an electrical substrate 150 and an underfill material 140 applied to a surface of electrical substrate 150. A solder mask 160 may also be applied to the surface of electrical substrate 150.

Underfill material 140 is disposed on a portion of electrical substrate 150. For example, underfill material 140 may be applied as a final step in the PWB or PCB fabrication process. The application process is simplified because the surface is relatively flat as compared with a bumped IC wafer. PCB fabricators may use one of several processes that are suitable for applying the underfill to the substrate, such as lamination or screen printing. The substrate with the underfill present on the board is then supplied to the surface mount technology (SMT) assembler for component mounting, eliminating the need for difficult capillary flow dispense operations after flip chips and other bumped devices are soldered in place.

Underfill material 140 provides a coating to protect the traces and pads of electrical substrate 150 and subsequently attached bumped flip chips and area-array devices. Underfill material 140 provides strain or stress relief for the solder bumps or solder balls when the bumped area-array devices are electrically connected to an electrical substrate. Underfill material 140 supplies additional bonding strength for the die attach. Underfill material 140 also provides stress relief at the solder ball interfaces during temperature excursions of the flip-chip assembly, and provides environmental protection from moisture, particles, and other contamination that may degrade the performance of the flip chip and other area-array devices.

Underfill material 140 is pre-applied to a plurality of locations on the surface of electrical substrate 150, for example, at flip-chip receiving regions where flip chips are to be positioned. Underfill material 140 may indicate flip-chip and bumped area-array device placement during flip-chip assembly. Flip chips and other bumped devices may be electrically and mechanically attached to electrical substrate 150 during flip-chip and bumped area-array assembly at these locations.

Underfill material 140 includes curable components that allow underfill material 140 to be pliable and formable during processing, yet hard and chemically resistant when bumped area-array devices are secured to electrical substrate 150. Underfill material 140 comprises any filled or unfilled dielectric material suitable for attaching flip chips and other bumped devices onto electrical substrate 150. Underfill material 140 may be a dry film or a b-stageable liquid whereby after an uncured, intermediate stage in the polymerization reaction, the material will soften with heat and is plastic and fusible until further cured. Underfill material 140 may comprise a filled epoxy, such as a one- or two-part epoxy that contains insulating microspheres to separate bumped devices from electrical substrate 150 during die attach processes. Fillers may be added to the selective underfill material to improve thermal expansion characteristics of the underfill material. Underfill material 140 may include, for example, an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, a fluxing underfill, a suitable underfill compound, or a combination thereof.

Underfill material 140 may include a plurality of openings over a set of pads 152 on electrical substrate 150 that correspond to a plurality of connective bumps extending from the interconnection surface of a subsequently attached bumped area-array device such as a bumped flip chip, a chip-scale package, a ball-grid array, an area-array package, a bumped electronic component, or a bumped electronic package. Electrical substrate 150 with pads 152 may also contain a number of electrical traces, contact openings, vias, dielectric layers, fiducials and indicia on the surface of electrical substrate 150, though not shown for clarity in elucidating the present invention. Electrical substrate 150 may contain an array of interconnect traces and substrate pads 152 for electrically connecting bumped devices to electrical substrate 150. Pads 152 correspond to connective bumps on a bumped device, such that pads 152 become electrically connected to corresponding connective bumps when the bumped device and electrical substrate 150 are assembled. Electrical substrate 150 may contain one or more active and passive devices bonded to electrical substrate 150 or formed on electrical substrate 150.

Electrical substrate 150 may be any substrate to which bumped devices can be attached. Electrical substrate 150 may be, for example, a single-layer or multiple-layer printed circuit board. Electrical substrate 150 may be, for example, a printed circuit board panel containing two or more printed circuit boards that are later excised or singulated to form individual printed circuit boards. Electrical substrate 150 may be, for example, a printed wiring board, a flame-retardant fiberglass (FR4) board, or any organic circuit board or motherboard as is currently known in the art. Electrical substrate 150 may be, for example, a ceramic substrate or a hybrid circuit substrate. Electrical substrate 150 may be, for example, an integrated circuit package, a lead frame, a semiconductor substrate, a polyimide tape, a flex circuit, a high-density interconnect board, an electronic module, or any electrical substrate upon which an underfill material 140 can be pre-applied prior to attaching or assembling bumped electrical or electronic devices.

Electrical substrate 150 may include a solder mask 160 disposed on the surface of electrical substrate 150. Solder mask 160 typically covers the surface of electrical substrate 150, with holes or open portions above pads and selected other features. Solder mask 160 constrains flow of the solder during assembly, preventing the solder from wetting metal traces and other metal features in protected areas. Solder mask 160 comprises any suitable material for protecting select areas of electrical substrate 150 during soldering processes.

Solder mask 160 serves to protect traces and other portions of electrical substrate 150 from fluxing and wave-soldering operations during assembly, and to provide environmental protection during use. Solder mask 160 may include openings over select pads 152, regions of the electrical substrate where flip chips and other bumped devices are to be attached, and other selected regions such as connector contacts where solder mask material is not desired. Solder mask 160 may be positioned external to or between underfill material 140 and electrical substrate 150.

Figure 1B:
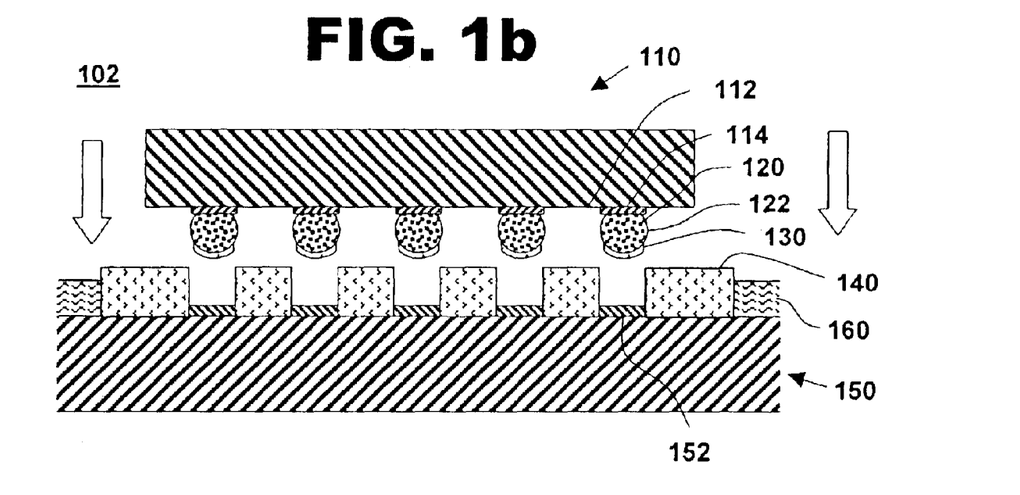
FIG. 1b illustrates a cross-sectional view of a bumped area-array device with flux on the bumps, and an electrical substrate with a solder mask and pre-applied underfill prior to attachment, in accordance with one embodiment of the current invention.

FIG. 1b shows a cross-sectional view of a bumped area-array device 110 with a flux layer on the bumps, and an electrical substrate 150 with a solder mask 160 and pre-applied underfill material 140 prior to attachment, in accordance with one embodiment of the present invention at 102. Bumped area-array device 110 has a plurality of connective bumps 120 with sides 122 connected to pads 114 on interconnection surface 112 of bumped area-array device 110. Connective bumps 120 correspond with pads 152 on electrical substrate 150 and windows or openings formed in underfill material 140. Bumped area-array device 110 is electrically and mechanically attached to electrical substrate 150 at receiving regions indicated by underfill material 140 positioned on electrical substrate 150.

Bumped area-array device 110 may be, for example, a bumped flip chip, a chip-scale package, a ball-grid array, an area-array package, a bumped electronic component, or a bumped electronic package including a set of connective bumps 120. Bumped area-array device 110 may contain a multitude of active components, passive components, or any combination thereof. Bumped area-array device 110 may contain electronic components such as resistors, capacitors, and transistors, configured, for example, as a flip chip or into a ceramic ball-grid array package. These components may be integrated into bumped area-array device 110, which may contain one or more integrated circuits. Bumped area-array device 110 may include a set of electrical interconnect traces, pads, vias, conductive layers and insulating layers not shown for clarity.

Connective bumps 120 comprise a plurality of solder bumps or a plurality of solder balls on the interconnection surface of bumped area-array device 110. Connective bumps 120 are formed on pads 114. A solder bump may be formed, for example, by electroplating one or more metals such as lead and tin to form a lead-tin solder bump. The solder bumps may be formed by depositing layers of one or more metals on interconnection surface 112 of bumped area-array device 110, and by using conventional lithographical techniques to pattern and etch any undesired metal. The solder bumps may be heat treated to melt the bumps and form rounded corners and tops. Alternatively, connective bumps 120 may be formed by positioning solder balls on the pads and heating the solder balls to adhere them to pads 114. Alternatively, connective bumps 120 may be formed by selectively screen printing solder paste on pads 114, and then heating to melt the solder and form the bumps. Connective bumps 120 have sides 122.

A flux layer 130 may be positioned on a top region of connective bumps 120. Flux layer 130 may include acidic components, for example, which remove oxides from the solder bumps or solder balls when melting or reflowing the bumps to an electrical substrate. Flux layer 130 may be located only on the top portions of the bumps, or may cover the tops of the bumps and underfill material 140 by using, for example, a spraying or a dipping technique.

Bumped area-array device 110 is positioned on electrical substrate 150 and heated to electrically connect connective bumps 120 to pads 152 on electrical substrate 150. When heated, underfill material 140 tends to flow around connective bumps 120. Underfill material 140 hardens through curing or solidification to securely attach bumped area-array device 110 to electrical substrate 150. Underfill material 140 provides stress relief for the bumps and a barrier for moisture and other environmental contaminants for the circuits, pads and interconnection. Electrical substrate 150 may be cut or singulated into individual substrates after flip-chip and area-array attachment.

Figure 1C:
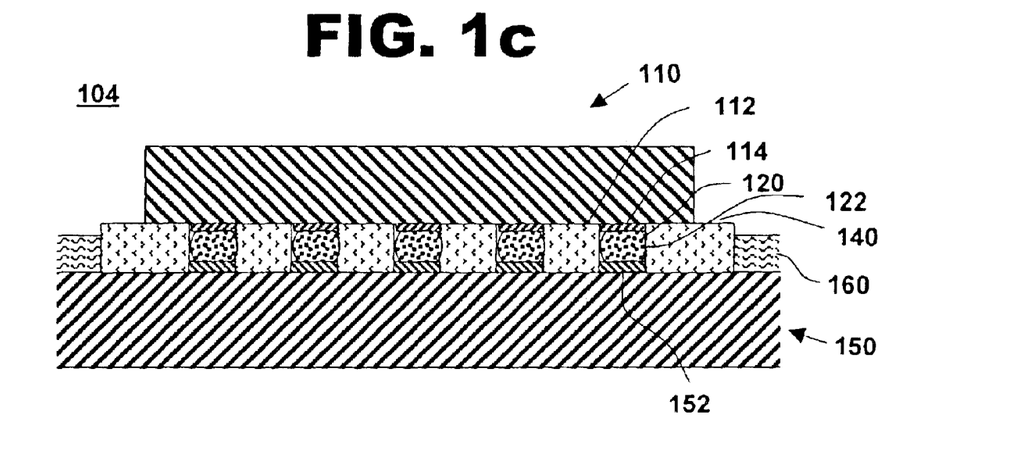
FIG. 1c illustrates a cross-sectional view of a bumped area-array device assembly, including a bumped area-array device and an electrical substrate with pre-applied underfill material, in accordance with one embodiment of the current invention.

FIG. 1c shows a cross-sectional view of a bumped area-array device assembly, including a bumped area-array device and an electrical substrate with pre-applied underfill material after attachment, in accordance with one embodiment of the present invention at 104. Bumped area-array device assembly 104 includes a bumped area-array device 110 such as a bumped flip chip, and an electrical substrate 150. One example of bumped area-array device assembly 104 is a flip-chip assembly.

Bumped area-array device 110 and electrical substrate 150 are typically connected by placing bumped area-array devices 110 on top of electrical substrate 150. Connective bumps 120 are formed on pads 114. Connective bumps 120 on bumped area-array device 110 are placed through holes or windows in pre-applied underfill material 140 corresponding to pads 152 on electrical substrate 150. An adhesive may be used to attach temporarily bumped area-array device 110 to electrical substrate 150. For example, applied flux may act as the adhesive, or bumped area-array device 110 or electrical substrate 150 may be heated to soften underfill material 140 and to provide a tacky surface for adhesion. After the bumped devices and other components are positioned on electrical substrate 150, the assembly may be sent through an infrared or convective or forced-air furnace to heat the flip chips and other components to electrically connect them to electrical substrate 150. The solder bumps or solder balls on the bumped devices melt and become soldered to electrical substrate 150. Underfill material 140 may soften and flow around sides 122 of connective bumps 120. Underfill material 140, when heated, may wet interconnection surface 112 of bumped area-array device 110 for improved adhesion. Similarly, underfill material 140 may wet electrical substrate 150 when heated for improved adhesion. Alternatively, bumped area-array device 110 may be locally heated and pressed against electrical substrate to reflow the connective bumps and to flow underfill material 140 around sides 122 of connective bumps 120.

Bumped area-array device 110 includes a plurality of connective bumps 120 extending from interconnection surface 112 of bumped area-array device 110. Interconnection surface 112 may be referred to as an active surface when bumped area-array device 110 is a flip chip. Connective bumps 120 may comprise a plurality of solder bumps or solder balls on interconnection surface 112 of bumped area-array device 110. For example, connective bumps 120 comprise a plurality of solder bumps or a plurality of solder balls on the active surface of the flip chip. Electrical substrate 150 includes a pre-applied underfill material 140 at a bumped area-array device or flip-chip receiving region. Bumped area-array device 110 is heated to electrically connect connective bumps 120 to pads 152 on electrical substrate 150 and to flow underfill material 140 from the bumped area-array device or flip chip receiving region around sides 122 of connective bumps 120 to secure bumped area-array device 110 to electrical substrate 150. Flux layers on the bumps or on electrical substrate 150 are typically consumed during the assembly. Flowed underfill material 140 provides a stress-relief layer and a moisture-penetration barrier for flip chip assembly or bumped area-array device assembly 104. In this embodiment, solder mask 160 is located on the surface of electrical substrate 150 external to underfill material 140.

When bumped area-array devices 110 are electrically connected to electrical substrate 150, flowed underfill material 140 bonds to the optional solder mask 160 to form a stress-relief layer and a moisture-penetration barrier. During reflow and curing, underfill material 140 may flow around connective bumps 120. After assembly, underfill material 140 secures bumped area-array devices 110 to electrical substrate 150, and to limit thermally-generated stresses that may occur at the interface between the bumps and the pads during large temperature excursions. Underfill material 140 provides improved solder joint integrity of bumped area-array device assemblies.

Underfill material 140 may also form fillets around the sides of bumped area-array device 110. During the reflow step and prior to curing, underfill material 140 may wet the sides of bumped area-array device 110, wicking up the sides and then hardening to form a smooth, protective coating for bumped area-array devices, electrical substrate 150, and other attached components.

Figure 2A:
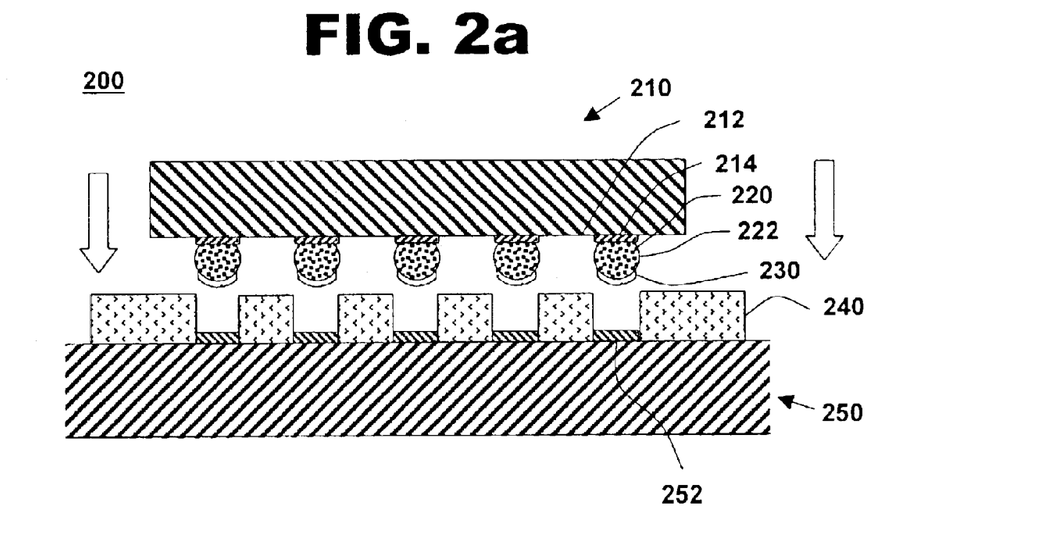
FIG. 2a illustrates a cross-sectional view of a bumped area-array device assembly, with flux on the bumped area-array device, and an electrical substrate with a pre-applied underfill, in accordance with one embodiment of the current invention.

FIG. 2a shows a cross-sectional view of a bumped area-array device assembly prior to bumped area-array device attachment, in accordance with one embodiment of the present invention at 200. Bumped area-array device 210 includes flux on the bumps, and an electrical substrate 250 includes a pre-applied underfill. Electrical substrate 250 includes pads 252 and pre-applied underfill material 240. Bumped area-array device 210 includes connective bumps 220 attached to pads 214 on an interconnection surface 212 of bumped area-array device 210. Bumped area-array device 210 may be a bumped flip chip, for example, or a chip-scale package, a ball-grid array, an area-array package, a bumped electronic component, a bumped electronic package, or any component that needs underfilling. Electrical substrate 250 may be, for example, a printed circuit board panel, a single-layer printed circuit board, a multiple-layer printed circuit board, a printed wiring board, a flame-retardant fiberglass board, an organic circuit board, a motherboard, a ceramic substrate, a hybrid circuit substrate, an integrated circuit package, a lead frame, a semiconductor substrate, a polyimide tape, a flex circuit, a high-density interconnect board, or an electronic module.

Connective bumps 220 with sides 222 may comprise a plurality of solder bumps or a plurality of solder balls. In this embodiment, a flux layer 230 is applied to at least a top portion of connective bumps 220. Alternatively, flux layer 230 may be applied to the sides and surface of bumped area-array device 210 using, for example, a dipping or spraying operation.

Underfill material 240 may be applied to a portion of electrical substrate 250, such as an area where bumped area-array device 210 is to be attached. Underfill material 240 may extend over a portion or the entire surface of electrical substrate 250, with holes or openings in underfill material 240 to allow connective bumps 220 to be electrically connected to pads 252 on electrical substrate 250. In this embodiment, the solder mask is omitted from electrical substrate 250, and underfill material 240 serves to protect traces and other elements of electrical substrate 250 from solder during soldering processes or from environmental conditions when in operation.

Interconnection surface 212 of bumped area-array device 210 is positioned next to or near the pre-applied underfill material 240 when heating and electrically connecting connective bumps 220 to electrical substrate 250. Flux layer 230 removes oxidized metals from pads 252 and cleans the surface in preparation of soldering. Underfill material 240 flows around connective bumps 220 to provide secure attachment and stress-relief for connective bumps 220. The flowed underfill material forms a stress-relief layer, a moisture-penetration barrier and protection from various environment hazards such as chemical spray and condensation.

Figure 2B:
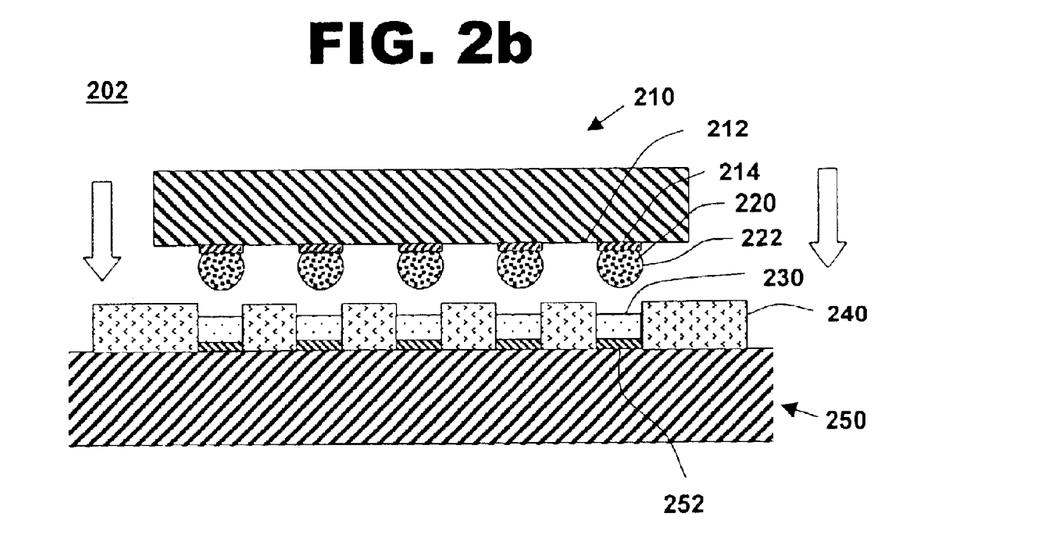
FIG. 2b illustrates a cross-sectional view of a bumped area-array device assembly, with a bumped area-array device and an electrical substrate with a pre-applied underfill and flux or solder paste, in accordance with one embodiment of the current invention.

FIG. 2b shows a cross-sectional view of a bumped area-array device assembly, with a bumped area-array device and an electrical substrate with a pre-applied underfill and flux or solder paste on the pads, in accordance with one embodiment of the present invention at 202. In this embodiment, a solder paste or flux layer 230 is applied to pads 252 on an interconnection surface of electrical substrate 250. Solder paste or flux layer 230 is applied using, for example, a screen or a stencil to dispense the material in selected locations such as the pad regions where bumped area-array devices are to be attached. Alternatively, the flux or paste may be pin transferred or needle dispensed onto individual pads. Solder paste or flux layer 230 comprises various cleaning agents and acidic components to remove any oxidized material on pads 252 during reflow sequences. Solder paste or flux layer 230 may be applied, for example, in openings and windows in underfill material 240 corresponding to connective bumps 220 on bumped area-array device 210. In this embodiment, no solder mask is used in the regions for flip chip or area-array device attachment. In another embodiment, the underfill material consists of two separate materials selectively applied, for example, using filled underfill material with unfilled, fluxing underfill material on the pads.

During reflow, connective bumps 220 on an interconnection surface 212 of bumped area-array device 210 connect pads 214 on bumped area-array device 210 to pads 252 on electrical substrate 250. Underfill material 240 flows around sides 222 of connective bumps 220, and when hardened through curing or solidification, provides stress-relief for the bumps or balls, and moisture-penetration barriers for bumped area-array device 210 and electrical substrate 250.

When an array of electrical substrates are simultaneously fabricated, electrical substrate 250 may be singulated to form individual substrates when the bumped area-array devices are electrically connected to the electrical substrate and the underfill material has been flowed around the bumps.

Figure 3:
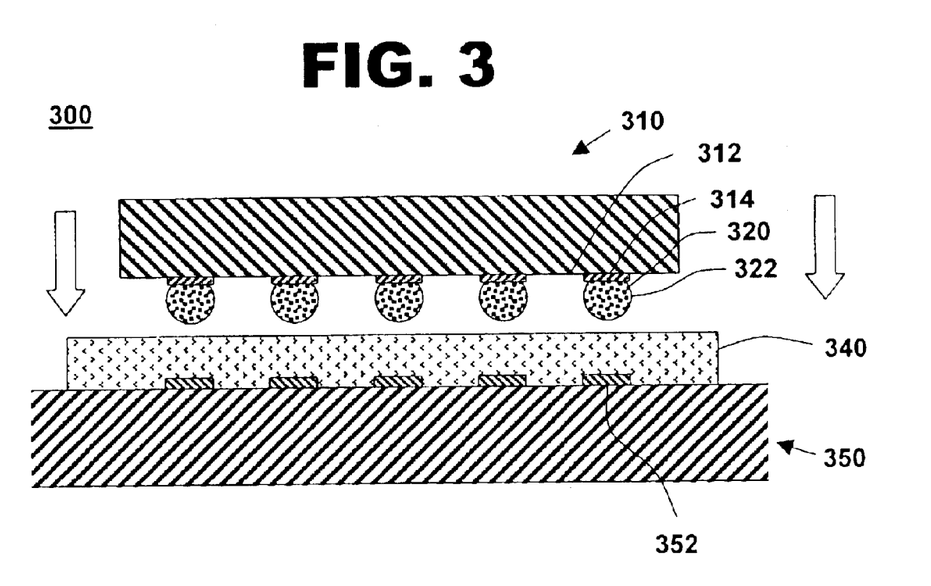
FIG. 3 illustrates a cross-sectional view of a bumped area-array device assembly, with a bumped area-array device and an electrical substrate with a pre-applied fluxing underfill, in accordance with one embodiment of the current invention.

FIG. 3 shows a cross-sectional view of a bumped area-array device assembly, with a bumped area-array device and an electrical substrate with a pre-applied fluxing underfill, in accordance with one embodiment of the present invention at 300. One example of a bumped area-array device is a bumped flip chip on a printed wiring board. In this embodiment, the underfill material replaces the solder mask.

Bumped area-array device assembly 300 includes a bumped area-array device 310 such as a bumped flip chip, a chip-scale package, a ball-grid array, an area-array package, a bumped electronic component, or a bumped electronic package. Bumped area-array device 310 includes a plurality of connective bumps 320 connected to pads 314 on an interconnection surface 312 of bumped area-array device 310. Connective bumps 320 comprise a plurality, for example, of solder bumps or solder balls.

Bumped area-array device assembly 300 also includes an electrical substrate 350, such as a printed circuit board panel, a single-layer printed circuit board, a multiple-layer printed circuit board, a printed wiring board, a flame-retardant fiberglass board, an organic circuit board, a motherboard, a ceramic substrate, a hybrid circuit substrate, an integrated circuit package, a lead frame, a semiconductor substrate, a polyimide tape, a flex circuit, a high-density interconnect board, or an electronic module.

A pre-applied underfill material 340 is selectively applied to electrical substrate 350. In this embodiment, underfill material 340 contains an interdispersed fluxing agent, referred to as a fluxing underfill, which cleans and strips oxide from the surfaces of pads 352 on electrical substrate 350 and from connective bumps 320 when bumped area-array device 310 is electrically connected to electrical substrate 350. Fluxing underfill material 340 may be filled or unfilled. Pre-applied underfill material 340 may have openings or windows for corresponding connective bumps 320 above pads 352. Pre-applied underfill material 340 may be uncured or partially cured such that the underfill layer softens when bumped area-array device 310 is heated and connected to electrical substrate 350, therefore requiring no holes or openings in underfill material 340 prior to positioning the interconnection surface of the bumped area-array device adjacent the applied underfill material. Underfill material 340 may flow around sides 322 of connective bumps 320 during the reflow process, and then harden to provide stress relief for connective bumps 320 and a moisture-penetration barrier for bumped area-array device 310 and electrical substrate 350. Underfill material 340 may be selectively applied to electrical substrate 350 to underlap, overlap or be coincident with the edges of bumped area-array device 310.

A solder mask may be applied between underfill material 340 and electrical substrate 350, applied externally to the region of bumped area-array device 310, or omitted entirely. When an array of electrical substrates are simultaneously fabricated, electrical substrate 350 may be singulated to form individual substrates after underfill material application and solder reflow.

Figure 4A:
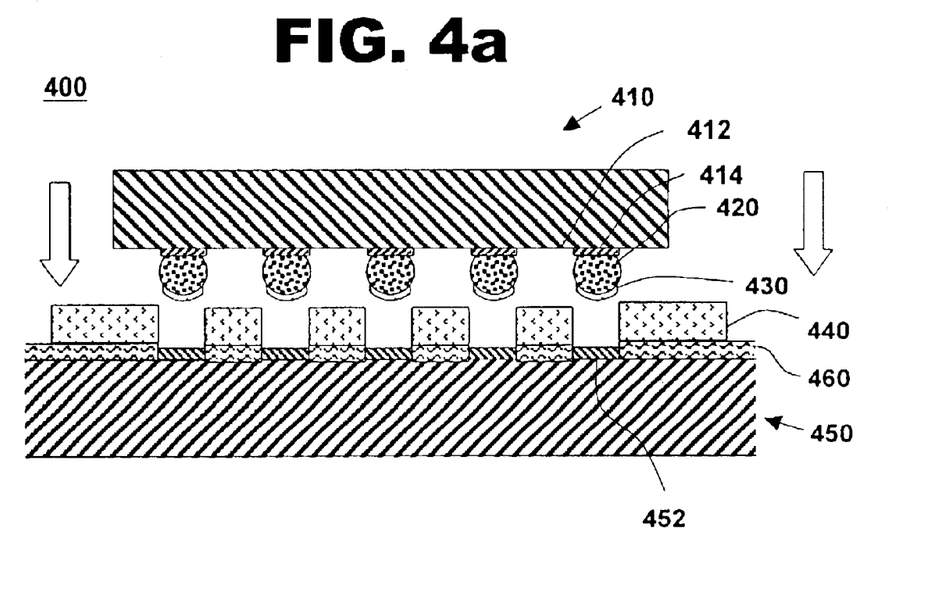
FIG. 4a illustrates a cross-sectional view of a bumped area-array device assembly, with a bumped area-array device with flux on the bumps, and an electrical substrate with a pre-applied underfill and an underlying solder mask, in accordance with one embodiment of the current invention.

FIG. 4a shows a cross-sectional view of a bumped area-array device assembly, in accordance with one embodiment of the present invention at 400. Bumped area-array assembly 400 includes a bumped area-array device 410 with a flux layer 430 on a plurality of connective bumps 420 extending from an interconnect surface 412 with pads 414, and an electrical substrate 450 with pre-applied underfill material 440 and an underlying solder mask 460. An example of bumped area-array assembly 400 is a flip-chip assembly.

Connective bumps 420 may comprise a plurality of solder bumps or solder balls on an interconnection surface of bumped area-array device 410. Bumped area-array device 410 may comprise, for example, a bumped flip chip, a chip-scale package, a ball-grid array, an area-array package, a bumped electronic component, or a bumped electronic package. Bumped area-array device 410 may comprise, for example, a flip chip with connective bumps 420 extending from an active surface of the flip chip.

Electrical substrate 450 may be, for example, a printed circuit board panel, a single-layer printed circuit board, a multiple-layer printed circuit board, a printed wiring board, a flame-retardant fiberglass board, an organic circuit board, a motherboard, a ceramic substrate, a hybrid circuit substrate, an integrated circuit package, a lead frame, a semiconductor substrate, a polyimide tape, a flex circuit, a high-density interconnect board, or an electronic module.

Solder mask 460 is positioned between the pre-applied underfill material 440 and electrical substrate 450. Solder mask 460 contains openings and windows to expose select pads 452 on electrical substrate 450 corresponding to connective bumps 420. Bumped area-array device 410 is heated to electrically connect connective bumps 420 to electrical substrate 450 with pre-applied underfill material 440 located at bumped area-array device receiving regions, and to flow underfill material 440 from bumped area-array device receiving regions around connective bumps 420 to secure bumped area-array device 410 to electrical substrate 450. Flux layer 430 is positioned on at least the top portions of connective bumps 420. When bumped area-array device 410 is electrically connected to electrical substrate 450, flowed underfill material 440 forms a stress-relief layer and a moisture-penetration barrier. After assembly, underfill material 440 protects connective bumps 420, pads 414, pads 452, and any connective traces on either bumped area-array device 410 or electrical substrate 450 from water, moisture build-up, or any inadvertent spray of chemicals or other materials that may corrode or otherwise damage bumped area-array assembly 400.

Figure 4B:
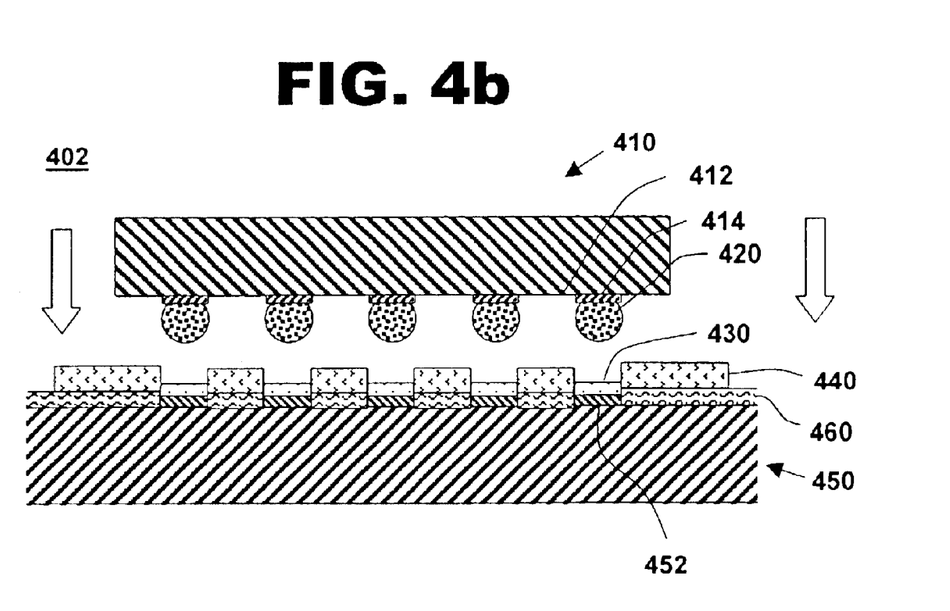
FIG. 4b illustrates a cross-sectional view of a bumped area-array device assembly, with a bumped area-array device and an electrical substrate with a pre-applied underfill and an underlying solder mask, with flux or solder paste on the pads of the electrical substrate, in accordance with one embodiment of the current invention.

FIG. 4b shows a cross-sectional view of a bumped area-array device assembly, with a bumped area-array device 410 and an electrical substrate 450 with a pre-applied underfill material 440 and an underlying solder mask 460, in accordance with one embodiment of the present invention at 402. Bumped area-array device 110 includes connective bumps 420 attached to pads 414 on an interconnection surface 412. Solder mask 460 is positioned between pre-applied underfill material 440 and electrical substrate 450. In this embodiment, a solder paste or flux layer 430 is positioned on pads 452 of electrical substrate 450 to aid in connecting bumped area-array device 410 such as a bumped flip chip or other bumped device to electrical substrate 450. When flux is used, it may be applied to a surface area extending beyond pads 452. Bumped area-array device 410 is heated to electrically connect connective bumps 420 to electrical substrate 450 and to flow pre-applied underfill material 440 from bumped area-array receiving regions on electrical substrate 450. Underfill material 440 flows around connective bumps 420 when heated. Underfill material 440 provides stress relief and a humidity-penetration barrier, and to secure bumped area-array device 410 to electrical substrate 450. Electrical substrate 450 may be singulated after reflow.

Figure 5A:
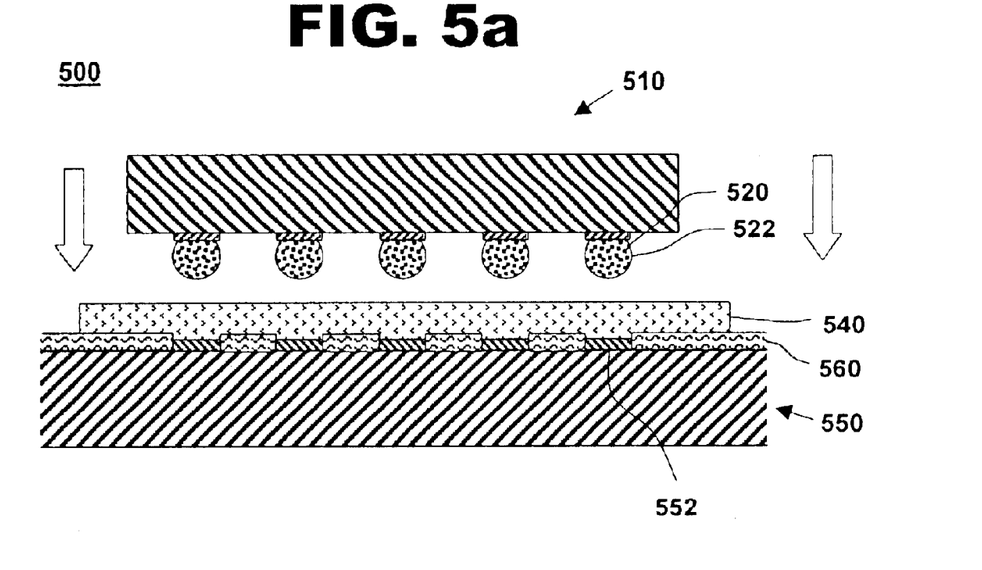
FIG. 5a illustrates a cross-sectional view of a bumped area-array device assembly, with a bumped area-array device and an electrical substrate with a pre-applied fluxing underfill material and an underlying solder mask, in accordance with one embodiment of the current invention.

FIG. 5a shows a cross-sectional view of a bumped area-array device assembly, in accordance with one embodiment of the present invention at 500. Bumped area-array device assembly 500 includes a bumped area-array device 510 such as a bumped flip chip, a chip-scale package, a ball-grid array, an area-array package, a bumped electronic component, or a bumped electronic package. Bumped area-array device 510 has a plurality of connective bumps 520 such as solder bumps or solder balls on an active or interconnection surface of bumped area-array device 510.

Bumped area-array device assembly 500 includes an electrical substrate 550 such as a printed circuit board panel, a single-layer printed circuit board, a multiple-layer printed circuit board, a printed wiring board, a flame-retardant fiberglass board, an organic circuit board, a motherboard, a ceramic substrate, a hybrid circuit substrate, an integrated circuit package, a lead frame, a semiconductor substrate, a polyimide tape, a flex circuit, a high-density interconnect board, or an electronic module. In this embodiment, electrical substrate 550 includes a pre-applied fluxing underfill material 540 and an underlying solder mask 560. Solder mask 560 is positioned between pre-applied fluxing underfill material 540 and electrical substrate 550.

Fluxing underfill material 540 contains a solder flux that cleans and deoxidizes surfaces of pads 552 on electrical substrate 550 when the bumped area-array device 510 is heated to electrically connect connective bumps 520 to pads 552 on electrical substrate 550 and to flow underfill material 540 from bumped area-array device receiving regions around sides 522 of connective bumps 520. Underfill material 540 secures bumped area-array device 510 to electrical substrate 550, and to provide a stress-relief layer and a moisture-penetration barrier.

Figure 5B:
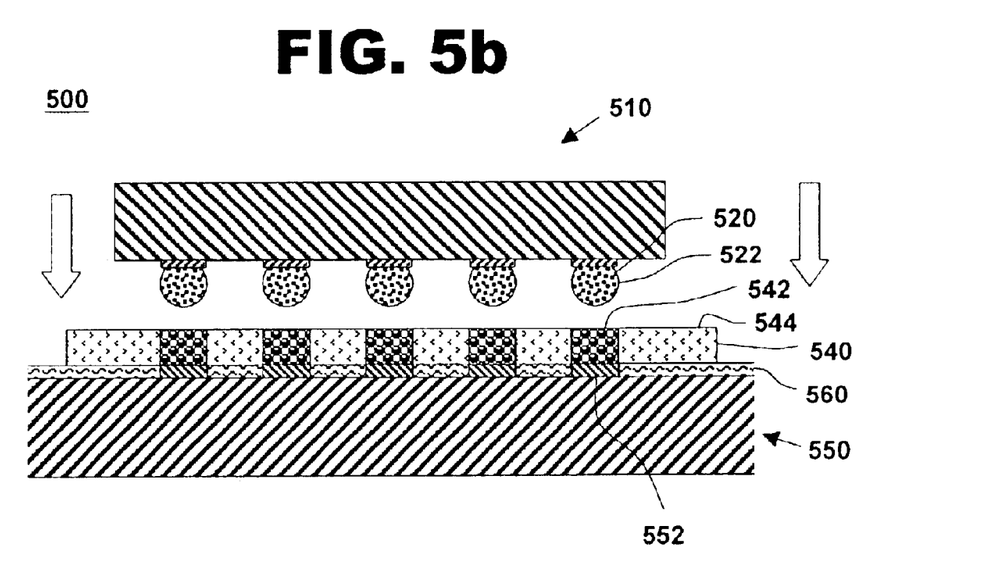
FIG. 5b illustrates a cross-sectional view of a bumped area-array device assembly, with a bumped area-array device and an electrical substrate including a pre-applied patterned underfill film with fluxing underfill portions and filled underfill portions, in accordance with one embodiment of the current invention.

FIG. 5b shows a cross-sectional view of a bumped area-array device assembly, with a bumped area-array device and an electrical substrate including a pre-applied patterned underfill film with fluxing underfill portions and filled underfill portions, in accordance with one embodiment of the present invention at 500. Bumped area-array device assembly 500 includes a bumped area-array device 510 such as a bumped flip chip, a chip-scale package, a ball-grid array, an area-array package, a bumped electronic component, or a bumped electronic package. Bumped area-array device 510 has a plurality of connective bumps 520 such as solder bumps or solder balls on an active or interconnection surface of bumped area-array device 510.

Bumped area-array device assembly 500 includes an electrical substrate 550 such as a printed circuit board panel, a single-layer printed circuit board, a multiple-layer printed circuit board, a printed wiring board, a flame-retardant fiberglass board, an organic circuit board, a motherboard, a ceramic substrate, a hybrid circuit substrate, an integrated circuit package, a lead frame, a semiconductor substrate, a polyimide tape, a flex circuit, a high-density interconnect board, or an electronic module. In this embodiment, electrical substrate 550 includes a pre-applied underfill material 540, wherein pre-applied underfill material 540 comprises a patterned underfill film. The patterned underfill film comprises a first portion 542 with a fluxing underfill and a second portion 544 with a filled underfill. First portion 542 with fluxing underfill is generally placed adjacent each pad 552 on electrical substrate 550 to aid in solder ball or solder bump attachment. First portion 542 of the patterned underfill film contains a solder flux that cleans and de-oxidizes surfaces of pads 552 on electrical substrate 550 when the bumped area-array device 510 is heated to electrically connect connective bumps 520 to pads 552 on electrical substrate 550. First portion 542 of the patterned underfill film may include a filler for improved thermal expansion coefficient matching, though typically does not include a filler. In one embodiment, second portion 544 of the patterned underfill film is non-fluxing although it includes a filler to improve thermal expansion coefficient matching.

Electrical substrate 550 may include an underlying solder mask 560. Solder mask 560 is positioned between pre-applied underfill material 540 and electrical substrate 550.

Underfill material 540 is heated to electrically connect connective bumps 520 to pads 552 on electrical substrate 550 and to flow underfill material 540 from bumped area-array device receiving regions around sides 522 of connective bumps 520. Underfill material 540 secures bumped area-array device 510 to electrical substrate 550, and to provide a stress-relief layer and a moisture-penetration barrier.

Figure 6:
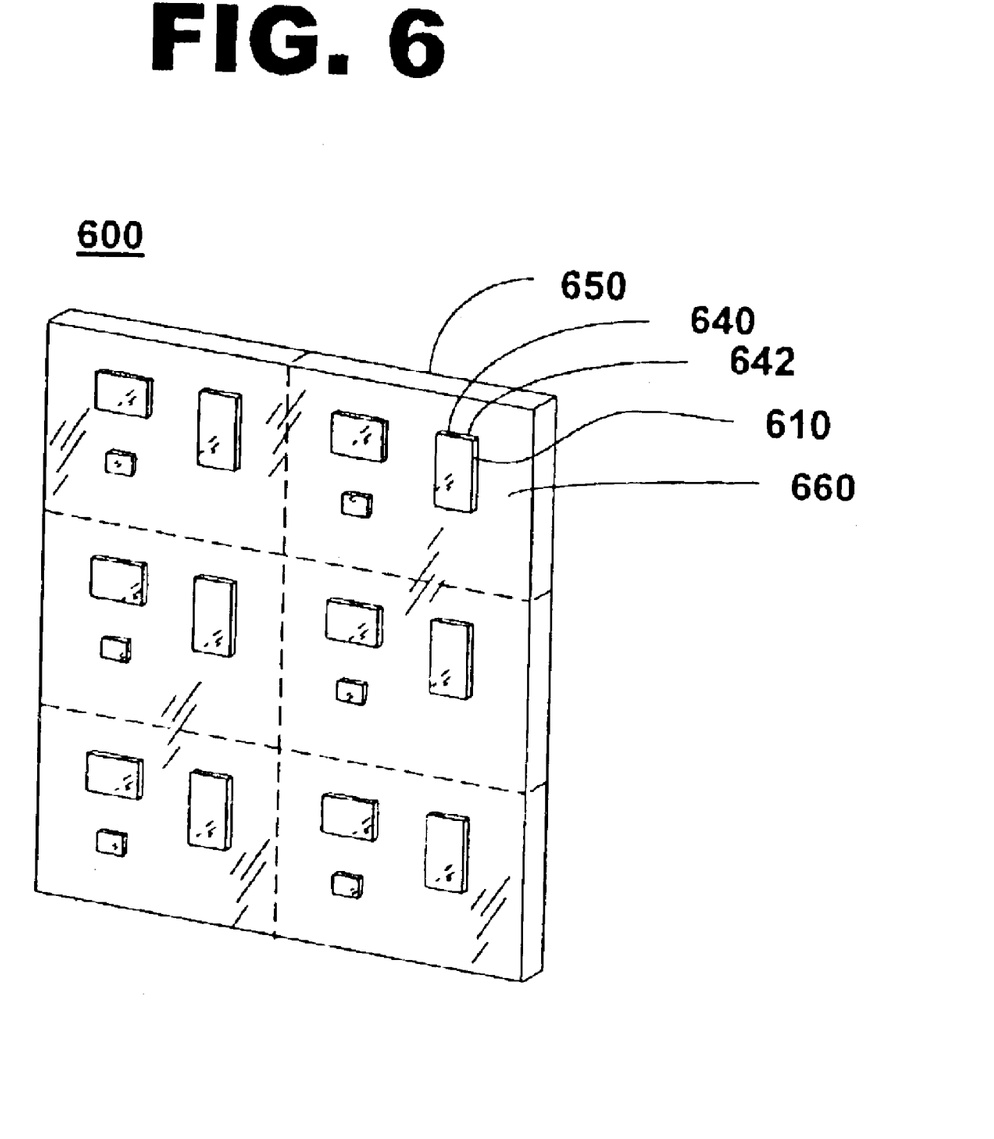
FIG. 6 shows an illustration of a printed wiring board panel with pre-applied underfill material, in accordance with one embodiment of the current invention.

FIG. 6 shows an illustration of a printed wiring board panel, in accordance with one embodiment of the present invention at 600. Printed wiring board panel 600 comprises a single-layer or a multiple-layer printed circuit board 650 including a pre-applied underfill material 640. Another example of a printed wiring board panel is a ceramic substrate with interconnection traces and pads that can be singulated after flip-chip assembly. Pre-applied underfill material 640 is disposed on a surface of printed circuit board 650 at a plurality of flip-chip receiving regions 642. Flip-chip receiving regions 642 indicate flip-chip placement during flip-chip assembly. A solder mask 660 may be positioned between underfill material 640 and printed circuit board 650. Printed wiring board panel 600 may be sawed or otherwise separated or singulated before or after bumped flip chips and other bumped area-array devices 610 such as a chip-scale package, a ball-grid array, an area-array package, a bumped electronic component, or a bumped electronic package are electrically connected to printed circuit board 650 and underfill material 640 has been flowed around the bumps. Pre-applied underfill materials on a printed circuit board allows PCB manufacturers to provide boards with pre-applied underfill material prior to shipping and subsequent surface mount assembly.

In one example, an underfill material is deposited on the PCB panel employing an appropriate technique such as stencil or screen printing, dispensing or film lamination, using multiple passes if needed. Underfill material 640 on the PCB may be formed in a selective pattern with one or more materials, for example, to form fluxing underfill circles on the soldering pads and filled underfill areas surrounding the pads. In this example, this step is performed as the final step in the PCB fabrication process, prior to sending the boards to a surface mount technology (SMT) assembly facility.

Figure 7:
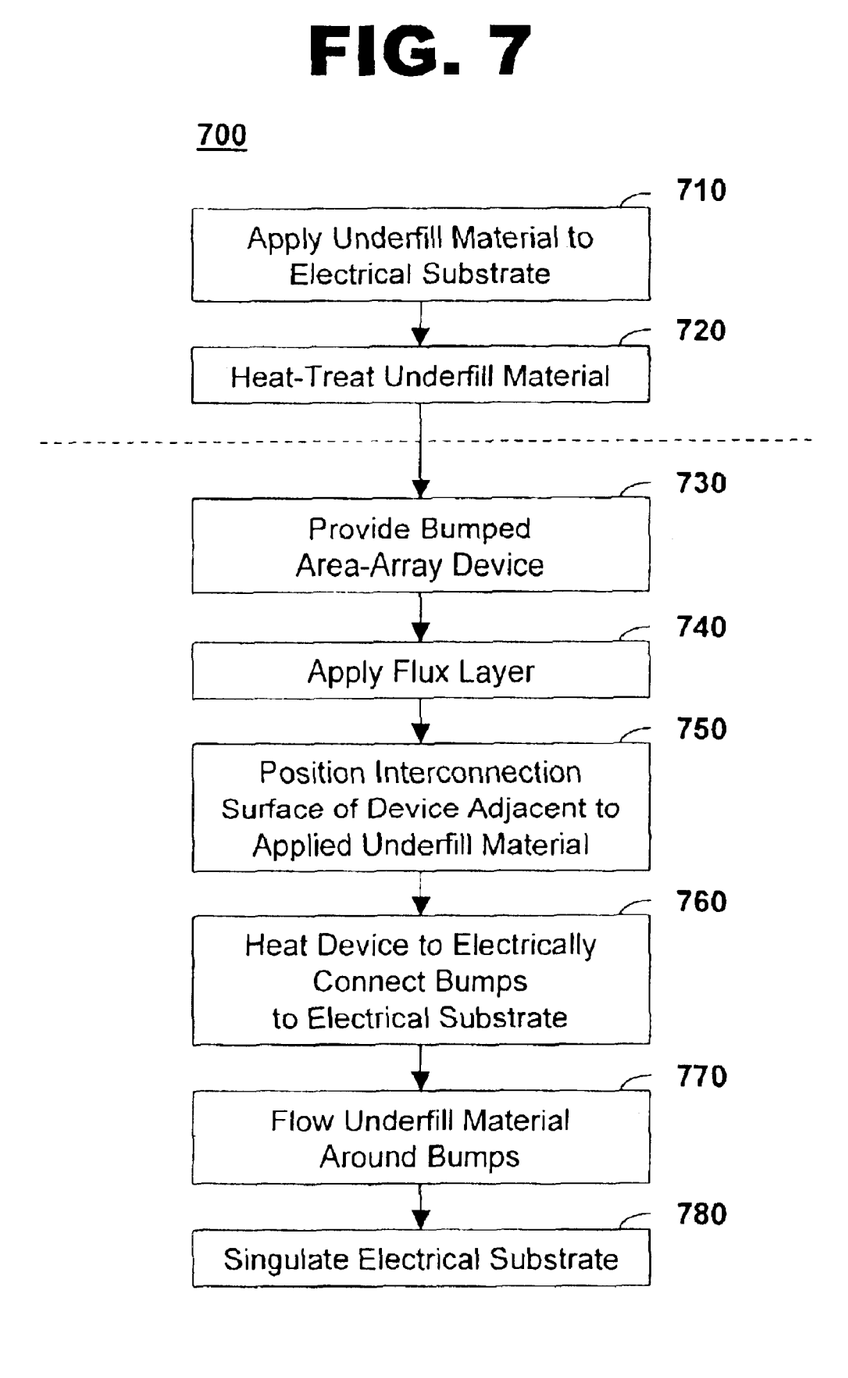
FIG. 7 is a flow diagram for a method of attaching a bumped area-array device to an electrical substrate, in accordance with one embodiment of the current invention.

FIG. 7 shows a flow diagram for a method of attaching a bumped area-array device to an electrical substrate, in accordance with one embodiment of the present invention at 700. Bumped area-array assembly method 700 includes steps to attach a bumped flip chip and other bumped devices to an electrical substrate.

An underfill material is applied to a portion of an electrical substrate, as seen at block 710. The underfill material may be applied, for example, at a PWB or PCB manufacturer prior to sending the PCB or PWB to an SMT assembler. The underfill material is used to attach bumped area-array devices to the electrical substrate. The underfill material may be located at a plurality of bumped area-array receiving regions on the surface of the electrical substrate, wherein the bumped area-array or flip-chip receiving regions indicate bumped area-array or flip-chip placement during bumped area-array or flip-chip assembly. The underfill material may include a plurality of openings corresponding to connective bumps extending from the interconnection surface of the subsequently attached bumped area-array device. The electrical substrate may be, for example, a printed circuit board panel, a single-layer printed circuit board, a multiple-layer printed circuit board, a printed wiring board, a flame-retardant fiberglass board, an organic circuit board, a motherboard, a ceramic substrate, a hybrid circuit substrate, an integrated circuit package, a lead frame, a semiconductor substrate, a polyimide tape, a flex circuit, a high-density interconnect board, or an electronic module.

The electrical substrate may have a solder mask on the interconnection surface. The solder mask may be positioned between the electrical substrate and the applied underfill material. The solder mask may be positioned in the bumped area-array receiving regions with openings or windows to expose underlying pads. The solder mask may be positioned on the surface of the electrical substrate external to the bumped area-array device receiving regions, or omitted completely in cases, for example, where the underfill material suitably serves as a solder mask.

The underfill material may be any suitable underfill film or b-stageable polymeric material. A b-stageable polymeric material refers to a polymeric compound that may be heat-treated to an uncured or non-cross-linked condition, such that subsequent heating may soften the material and then incur further cross-linking and hardening when cured. The underfill material may be, for example, an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, a fluxing underfill, a suitable underfill compound, or a combination thereof.

The underfill material may be applied by positioning a patterned mask against the electrical substrate, and dispensing the underfill material through the patterned mask. The patterned mask may include, for example, a stencil or a screen with patterned features. The patterned mask typically has features such as cutouts and windows to allow underfill material to be applied through the cutouts or screen and onto the electrical substrate at, for example, bumped area-array device receiving regions or flip-chip receiving regions. The patterned mask typically comprises a fine-mesh screen with one or more barrier features on the screen. Alternatively, the patterned mask may be a stencil with holes and other features punched or formed in a sheet of material such as plastic or metal. The barrier features may include features that cover, for example, locations where no underfill material is desired. The underfill material does not need to completely cover the package footprint on the electrical substrate, for example, in the case of bumped integrated circuit packages.

The patterned mask is aligned to the electrical substrate. The underfill material may be in the form of a viscous liquid, paste, gel, suspension, or slurry such that the underfill material can be applied through the screen or stencil. The underfill material may then be dried and stabilized, partially cured, or otherwise solidified. The underfill material is often dried to remove the majority or all of the solvents from the underfill material. The underfill material may be dried by heating the electrical substrate to an underfill material drying temperature, or by evaporating off solvents from the underfill material in a vacuum or otherwise controlled environment. Additional underfill layers may be added when thicker underfill material is desired. If needed, openings for the bumps may be made in the underfill material using laser ablation, photo-patterning, or any suitable feature formation process. In one example, two separate underfill materials are selectively applied, using filled underfill material with unfilled, fluxing underfill material on the pads.

Alternatively, the underfill material may be applied by positioning a patterned underfill film against the electrical substrate, and pressing the patterned underfill film onto the electrical substrate. The underfill material is applied by positioning a patterned underfill film against the surface of the electrical substrate, and pressing the patterned underfill film onto the electrical substrate. For example, the underfill material may be applied to a printed circuit board using a die-cut film, a laminate of an underfill material and a backing layer, or another sheet form of patterned underfill material. The patterned underfill film includes a thin layer of underfill material such as an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, a fluxing underfill, a suitable underfill compound, or a combination thereof. The backing layer may be a transparent plastic, mylar or acetate sheet used to support the underfill material.

Windows, apertures, package outlines, flip chip outlines and other features are typically formed in the underfill layer. The underfill material may be cut or punched with a die to form prescribed shapes. Alternatively, the underfill material may be selectively ablated with a laser, or fashioned into the desired patterns using any suitable formation technique. The underfill film may comprise two portions, a first portion with fluxing underfill over the soldering pads and a second portion with filled underfill in select regions surrounding the pads. The fluxing underfill over the soldering pads may be filled, though is generally unfilled. Other portions of the underfill film may be void of underfill material, for example, to uncover optical or electromechanical components on the flip chip or electrical substrate.

The die-cut film or patterned underfill film of one exemplary embodiment is aligned to the electrical substrate at a predefined receiving region, positioned against the surface of the electrical substrate, and pressed onto the electrical substrate while heating to adhere the underfill material to the electrical substrate. The backing layer then can be removed. In another embodiment, the region between the patterned underfill film and the electrical substrate is pumped out to remove any trapped air, and then the underfill material is heated with the electrical substrate to laminate the underfill material to the electrical substrate. A typical lamination temperature is between 60 degrees centigrade and 100 degrees centigrade, for example. The patterned underfill film may be pressed with a hot roller, with a press, or with any suitable pressing mechanism. Alternatively, the patterned underfill film may be laminated by pumping out a region between the patterned underfill film and the electrical substrate to remove trapped air and to firmly hold the patterned underfill film against the electrical substrate, and by heating the patterned underfill film and the electrical substrate to a lamination temperature. The electrical substrate and the patterned underfill film are heated to a lamination temperature usually between 60 degrees centigrade and 100 degrees centigrade. The backing layer is removed from the patterned underfill film, and the underfill material layer remains laminated to the electrical substrate. The backing layer may be removed by peeling back or otherwise separating it from the underfill material and the electrical substrate.

The underfill material is heat-treated, as seen at block 720. The underfill material may be heated to an underfill-material staging temperature, to dry the material and to provide a desired level of tackiness and cross-linking. The underfill material is heat-treated in a process sometimes referred to as b-staging to dry the film. The temperature and time for heat-treating and the viscosity of the underfill material may be selected such that the underfill material largely retains its patterned shapes and does not cover pad regions on the electrical substrate. The underfill material may be heated to a predefined temperature to drive out the remaining solvents and to solidify the material, allowing a small degree of cross-linking. Underfill materials based on epoxies and other polymeric materials are typically heated to an underfill-material staging temperature to dry the underfill material such that the underfill material is no longer tacky. The underfill material may be dried and remain uncured or be partially cured after the heating step. The underfill-material staging temperature may be between, for example, 80 degrees centigrade and 150 degrees centigrade. The heat-treatment step is often done in a controlled environment such as air, nitrogen, or vacuum. Staging temperatures are typically sustained for thirty minutes to over two hours.

After pre-applied underfill material application, the electrical substrates may be assembled with flip chips and other bumped devices. For example, the electrical substrates with pre-applied underfill material may be fabricated at a PWB or PCB manufacturer, and then sent to an SMT assembler. A release liner may be placed over the electrical substrates, for example, to protect the underfill material when the electrical substrates are stacked and packaged for shipping. Upon unpackaging the electrical substrates and loading them into a screen printer for surface mount processing, the release liners are removed and discarded with other packing materials. At the SMT assembler, flip chips, bumped area-array devices and other electronic components may be attached to the electrical substrate with pre-applied underfill material.

A bumped area-array device is provided, as seen at block 730. The bumped area-array device may be a bumped flip chip or a chip-scale package, a ball-grid array, an area-array package, a bumped electronic component, a bumped electronic package, or any bumped electronic component. The bumped area-array device includes an interconnection surface and a plurality of connective bumps extending from the interconnection surface. The interconnection surface is often referred to as an active surface for a bumped flip chip. The bumped area-array device includes a plurality of connective bumps such as solder bumps or solder balls on the interconnection surface of the bumped area-array device.

A flux layer may optionally be applied to the bumped devices or to the electrical substrate, as seen at block 740. The flux layer may be applied to the tops of the connective bumps, or to connective bumps and the interconnect surface of the bumped area-array device. The flux may be applied to at least a top portion of the connective bumps prior to positioning the interconnection surface of the bumped area-array device adjacent the applied underfill material. Alternatively, the flux layer may be applied to the electrical substrate by dipping or spraying, or applied locally to select pads on the electrical substrate by needle dispensing, pin transfer, or using a screened mask, stencil or other patterned mask. The flux layer may be applied by spraying the active side of the bumped device or a select area of the electrical substrate. Alternatively, the flux layer may be applied by dipping the electrical substrate or the bumped area-array devices into a flux bath or flux solution and then dried. In some examples, the flux layer may be applied prior to application of the underfill material. In an alternative embodiment, a fluxing underfill material is used that eliminates the need for a separate flux layer. In another embodiment, the flux layer is not applied, for example, when non-oxidizing metals are used for the bumps and the pads, or when the bumps are thermosonically bonded to pads on the electrical substrate.

The interconnection surface of the bumped area-array device is positioned adjacent the applied underfill material, as seen at block 750. The tops of the bumps may be placed against the underfill material. In another embodiment, the connective bumps are placed in openings or windows in a solder mask disposed on the surface of the electrical substrate. In another embodiment, the connective bumps are placed in openings or windows in the underfill material disposed on the surface of the electrical substrate. In yet another embodiment, the connective bumps are placed in openings or windows in underfill material and the underlying solder mask. In yet another embodiment, the interconnection or active surface of the bumped area-array device is placed in contact with the pre-applied underfill material.

The underfill material may be used to hold the component in place during positioning. The surface of the underfill material may be tacky, or become tacky upon heating. For example, the component can be pre-heated during the placement step and positioned against the electrical substrate.

The bumped area-array device is heated to electrically connect the connective bumps to the electrical substrate, as seen at block 760. The bumped area-array device may be heated to or above a reflow temperature of the bumped area-array device. At this temperature, the solder in the bumps or balls melts and metallurgically attaches to pads on the electrical substrate. The bumped area-array devices and electrical substrate may be heated, for example, in a convective oven or by passing them through a forced-air furnace equipped with a conveyor belt. The reflow temperature may exceed the liquidus temperature of the solder bumps or balls, causing the connective bumps to melt and metallurgically bond to pads on the electrical substrate. After a dwell time of, for example, twenty seconds to two minutes or more, the heat source may be removed and the flip-chip assembly cooled to room temperature. The reflow temperature, for example, may be between 183 degrees centigrade and 220 degrees centigrade for lead-tin solder bumps. The reflow temperature, for example, may be between 220 degrees centigrade and 250 degrees centigrade for lead-free or low lead-content bumps. The reflow temperature may extend as low as 160 degrees centigrade or lower when low-temperature solders based on indium or other materials are used.

The electrical substrate with the electrically connected bumped devices is heated to flow the underfill material around the bumps, as seen at block 770. The underfill material initially softens at the elevated temperature, allowing the underfill material to flow around the bumps of the flip chips and other bumped area-array devices. The reflow temperature may be sufficient to allow the underfill material to flow around the side regions of the connective bumps. When heated, the underfill material may wet the electrical substrate and the interconnection surface of the bumped area-array device to improve adhesion between the bumped area-array device and the electrical substrate.

Further heating at the same or higher temperatures, or at a lower intermediate temperature allows curable underfill materials to further harden by curing. Additional heat cycles may be added to further cure the underfill material and to improve the adhesive bond between the underfill material and the solder mask. When cured, the underfill material or the underfill material and an underlying solder mask comprise a stress-relief layer and a moisture-penetration barrier for the bumped area-array device and the electrical substrate. Other underfill materials such as thermoplastic underfill materials may harden upon cooling without curing.

An encapsulant or other suitable protective material may subsequently encase the bumped area-array device assembly. In some embodiments, a post-cure step is incorporated. The underfill material may be heated to an underfill post-cure temperature of between, for example, 100 degrees centigrade and 150 degrees centigrade, for a time on the order of 15 to 30 minutes.

In cases where the electrical substrate includes an array of smaller substrates, the electrical substrate may be cut or singulated when the bumped area-array devices are electrically connected to the electrical substrate and the underfill material has been flowed around the bumps, as seen at block 780. Alternatively, the electrical substrates or panels may be cut or singulated after applying and heat-treating the underfill material, and then the bumped flip chips and other bumped area-array devices are attached to the singulated substrates or boards.

While the embodiments of the invention disclosed herein are presently preferred, various changes and modifications can be made without departing from the spirit and scope of the invention. The scope of the invention is indicated in the appended claims, and all changes that come within the meaning and range of equivalents are intended to be embraced therein.

What is claimed is:

1. A method of attaching an area-array device to an electrical substrate, comprising:

applying an underfill material to a portion of the electrical substrate;

heating the applied underfill material to an underfill-material staging temperature;

providing a bumped area-array device, the bumped area-array device including an interconnection surface and a plurality of connective bumps extending from the interconnection surface;

positioning the interconnection surface of the bumped area-array device adjacent the applied underfill material;

heating the bumped area-array device to electrically connect the connective bumps to the electrical substrate; and flowing the underfill material around the bumps.

2. The method of claim 1 wherein the area-array device is selected from the group consisting of a bumped flip chip, a chip-scale package, a ball-grid array, an areal-array package, a bumped electronic component, and a bumped electronic package.

3. The method of claim 1 wherein the electrical substrate is selected from the group consisting of a printed circuit board panel, a single-layer printed circuit board, a multiple-layer printed circuit board, a printed wiring board, a flame-retardant fiberglass board, an organic circuit board, a motherboard, a ceramic substrate, a hybrid circuit substrate, an integrated circuit package, a lead frame, a semiconductor substrate, a polyimide tape, a flex circuit, a high-density interconnect board, and an electronic module.

4. The method of claim 1 wherein the connective bumps comprise a plurality of solder bumps or a plurality of solder balls on the interconnection surface of the bumped area-array device.

5. The method of claim 1 wherein applying the underfill material comprises:

positioning a patterned mask against the electrical substrate; and dispensing the underfill material through the patterned mask.

6. The method of claim 5 wherein the patterned mask comprises one of a stencil or a screen with patterned features.

7. The method of claim 1 wherein applying the underfill material comprises:

positioning a patterned underfill film against the electrical substrate; and pressing the patterned underfill film onto the electrical substrate.

8. The method of claim 1 wherein the underfill material includes a plurality of openings corresponding to the plurality of connective bumps extending from the interconnection surface of the bumped area-array device.

9. The method of claim 1 wherein the underfill materials is selected from the group consisting of an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, a fluxing underfill, a suitable underfill compound, and a combination thereof.

10. The method of claim 1 wherein the bumped area-array device is heated to a reflow temperature of the bumped area-array device.

11. The method of claim 1 wherein the flowed underfill material comprises a stress-relief layer.

12. The method of claim 1 wherein the electrical substrate includes a solder mask positioned between the electrical substrate and the applied underfill material.

13. A method of attaching an area-array device to an electrical substrate, comprising:

applying an underfill material to a portion of the electrical substrate, wherein applying the underfill material includes positioning a patterned underfill film against the electrical substrate and pressing the patterned underfill film onto the electrical substrate, the patterned underfill film having a first portion including a fluxing underfill and a second portion including a filled underfill;

heating the applied underfill material to an underfill-material staging temperature;

providing a bumped area-array device, the bumped area-array device including an interconnection surface and a plurality of connective bumps extending from the interconnection surface;

positioning the interconnection surface of the bumped area-array device adjacent the applied underfill material;

heating the bumped area-array device to electrically connect the connective bumps to the electrical substrate; and flowing the underfill material around the bumps.

14. A method of attaching an area-array device to an electrical substrate, comprising:

applying an underfill material to a portion of the electrical substrate;

heating the applied underfill material to an underfill-material staging temperature;

providing a bumped area-array device, the bumped area-array device including an interconnection surface and a plurality of connective bumps extending from the interconnection surface;

positioning the interconnection surface of the bumped area-array device adjacent the applied underfill material;

heating the bumped area-array device to electrically connect the connective bumps to the electrical substrate; and flowing the underfill material around the bumps, wherein the flowed underfill material comprises a moisture-penetration barrier.

15. A method of attaching an area-array device to an electrical substrate, comprising:

applying an underfill material to a portion of the electrical substrate;

heating the applied underfill material to an underfill-material staging temperature;

providing a bumped area-array device, the bumped area-array device including an interconnection surface and a plurality of connective bumps extending from the interconnection surface;

applying a flux layer to at least a top portion of the connective bumps;

positioning the interconnection surface of the bumped area-array device adjacent the applied underfill material;

heating the bumped area-array device to electrically connect the connective bumps to the electrical substrate; and flowing the underfill material around the bumps.

16. A method of attaching an area-array device to an electrical substrate, comprising:

applying an underfill material to a portion of the electrical substrate;

heating the applied underfill material to an underfill-material staging temperature;

providing a bumped area-array device, the bumped area-array device including an interconnection surface and a plurality of connective bumps extending from the interconnection surface;

positioning the interconnection surface of the bumped area-array device adjacent the applied underfill material;

heating the bumped area-array device to electrically connect the connective bumps to the electrical substrate;

flowing the underfill material around the bumps; and singulating the electrical substrate when the bumped area-array device is electrically connected to the electrical substrate and the underfill material has been flowed around the bumps.

* * * * *